United States Patent
Schmidt et al.

(10) Patent No.: US 10,461,715 B1
(45) Date of Patent: Oct. 29, 2019

(54) MITIGATING POWER NOISE USING A CURRENT SUPPLY

(71) Applicant: International Business Machines Corporation, Armonk, NY (US)

(72) Inventors: Martin Bernhard Schmidt, Stuttgart (DE); Thomas Strach, Wildberg (DE); Hubert Harrer, Schoenaich (DE); Jochen Supper, Nufringen (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/196,080

(22) Filed: Nov. 20, 2018

(51) Int. Cl.
*G06F 1/28* (2006.01)
*G06F 1/30* (2006.01)
*H03H 1/02* (2006.01)
*G06F 1/26* (2006.01)

(52) U.S. Cl.
CPC .............. *H03H 1/02* (2013.01); *G06F 1/263* (2013.01)

(58) Field of Classification Search
CPC combination set(s) only.
See application file for complete search history.

(56) References Cited

U.S. PATENT DOCUMENTS

| | | | |
|---|---|---|---|
| 7,342,405 B2 * | 3/2008 | Eldridge | G01R 31/31721 324/754.03 |
| 7,755,381 B1 | 7/2010 | Alfke et al. | |
| 8,278,998 B2 | 10/2012 | Kajita | |
| 9,395,782 B2 | 7/2016 | Berry, Jr. et al. | |
| 2010/0156369 A1 | 6/2010 | Kularatna et al. | |
| 2014/0374877 A1 | 12/2014 | Oh et al. | |

OTHER PUBLICATIONS

E. Backenius et al. , "Reduction of Simultaneous Switching Noise in Digital Circuits", Department of Electrical Engineering, SE-581 83 Linkoping University, Sweden, 4 pages.
Lloyd Dixon, "Average current mode control of switching power supplies", Unitrode Corporation, U-140, 14 pages.
Michael D. Powell, et al., "Pipeline Muffling and a Priori Current Ramping: Architectural Techniques to Reduce High-Frequency Inductive Noise", Proceedings of the 2003 international symposium on Low power electronics and design, Aug. 25-27, 2003, 1 page.

* cited by examiner

*Primary Examiner* — An T Luu

(74) *Attorney, Agent, or Firm* — Cantor Colburn LLP; Tihon Poltavets

(57) ABSTRACT

Provided are embodiments including methods, systems, and computer-program products for mitigating power supply noise using one or more current supplies. In some embodiments, power is provided to an integrated circuit, wherein a first circuit is coupled to the integrated circuit over a first path. A variation of the current level of the integrated circuit may be determined. Additional power from a second circuit is provided to the integrated circuit may be provided based at least in part on the determined variation, wherein the second circuit is coupled to the integrated circuit over a second path.

20 Claims, 6 Drawing Sheets

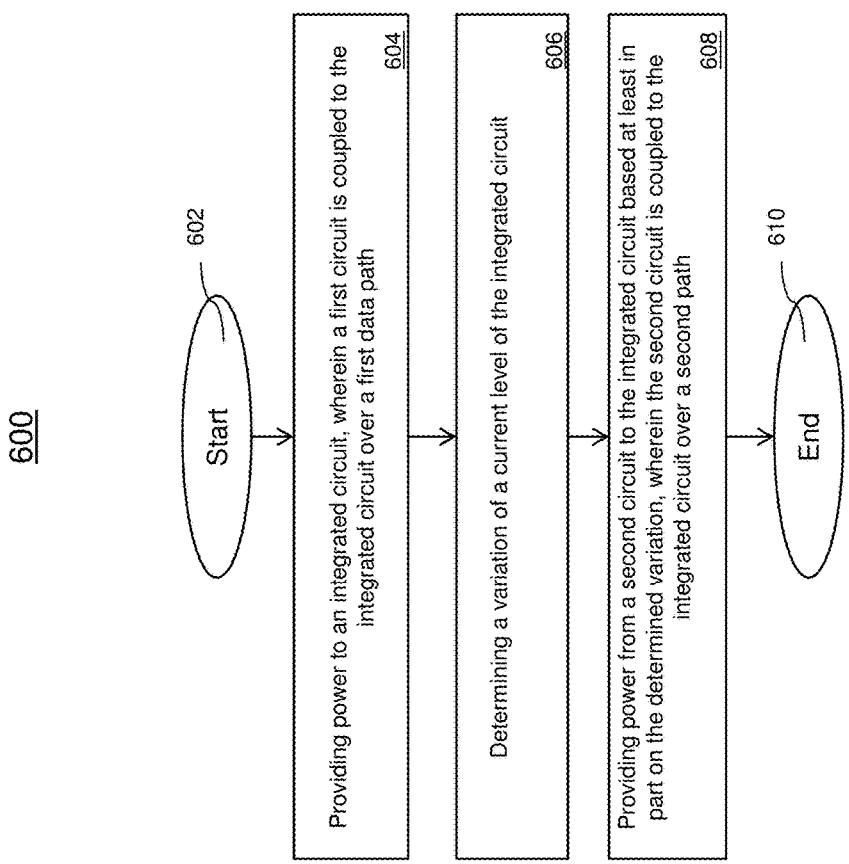

MITIGATING POWER NOISE USING A CURRENT SUPPLY

BACKGROUND

The present invention generally relates to integrated circuits ("ICs"), and more specifically to mitigating power noise using a current supply.

Integrated circuits such as processors continue to operate at faster clock speeds. Power generated and distributed from a power source to assemblies or subassemblies of circuits operating on a processor can generate power supply noise which can adversely impact system functionality and operation of high-speed processors.

Power supply noise generated from the power source, which is propagated to assemblies and subassemblies of circuits, can cause voltage dips in critical paths of the processor. Voltage dips in critical paths can affect the speed at which the processor operates. Moreover, variations in manufacturing of components that both generate and deliver power from the power source to assemblies and subassemblies of circuits operating on the processor can exacerbate power supply noise effects. These subtle effects are difficult to detect and distinguish from workload variations executed on the processor.

SUMMARY

Embodiments of the present invention are directed to a method for mitigating power noise using a current supply. A non-limiting example of the method includes providing power to an integrated circuit, wherein a first circuit is coupled to the integrated circuit over a first path. The method also includes determining a variation of a current level of the integrated circuit, and providing additional power from a second circuit to the integrated circuit based at least in part on the determined variation, wherein the second circuit is coupled to the integrated circuit over a second path.

Embodiments of the present invention are directed to a system for mitigating power noise using a current supply. A non-limiting example of the system includes an integrated circuit operably coupled to a first circuit over a first path, and a controller configured to determine a variation of a current level in the integrated circuit. The system also includes a second circuit operably coupled to the integrated circuit over a second path, wherein the second circuit is configured to provide additional power to the integrated circuit based at least in part on the determined variation of the current level.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 6 depicts a flowchart of a method for performing the mitigation of power supply noise using a current supply in accordance with one or more embodiments of the invention.

Figure 1:
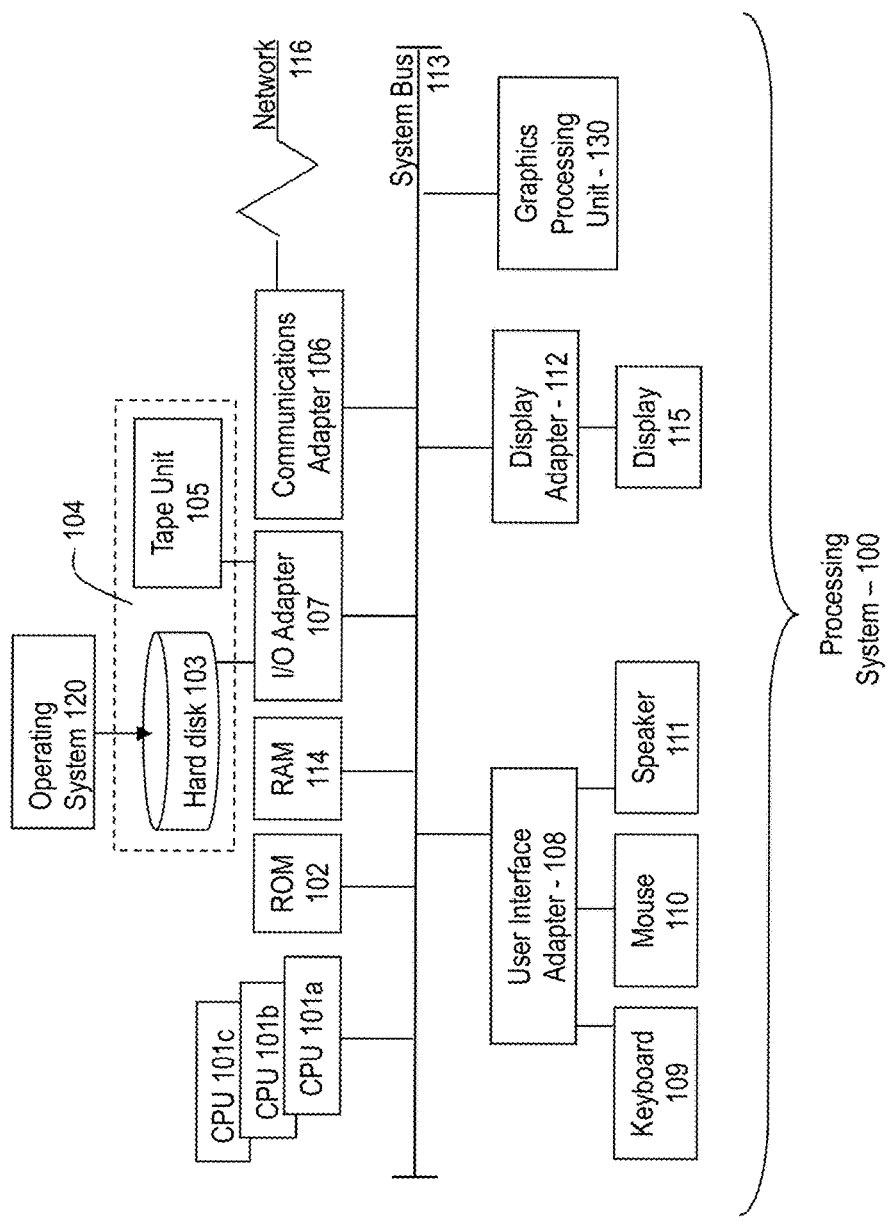
FIG. 1 is a block diagram illustrating one example of a processing system for practice of the teachings herein.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e.

two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, a supply voltage is provided to an integrated circuit which performs various processing tasks. As the number of tasks, the complexity of the tasks, and the speed for processing the tasks increases, the greater the impact the power fluctuations may have on the performance of the integrated circuits.

Oftentimes, decoupling capacitors are used to compensate for variations in the power provided to the integrated circuit. Decoupling capacitors are often used to help provide more stable power supply voltages to circuits in integrated circuits. A decoupling capacitor shunts high frequency noise on a direct current (DC) supply voltage line to a ground supply line, thereby preventing noise from reaching circuits on an integrated circuit that receive the supply voltage. Decoupling capacitance acts as a store of charge that provides current to maintain a stable supply voltage during circuit operation. The negative impacts can be detected by sensing a critical path delay in the processor. The critical path within the processor is typically a signal path that is susceptible to the deleterious effects of power supply noise including loss in a voltage supplied to the processor.

However, if the parasitic effects such as inductance are significant on the conductors between the power supply and the processor, the capacitor may not provide a sufficient charge to the integrated circuit to meet the operational specification of circuits of the integrated circuit. The capacitance of a capacitor is linked strongly to its size and to its bandwidth. The larger the capacitance is the larger is its size and the smaller is its bandwidth. As more and more decoupling capacitors are included in the circuit or as larger capacitors are used the valuable space on the circuit board is used. This variation in voltage provided at the power input directly impacts the performance of the integrated circuit as the dynamic power demand changes based on the operation of the integrated circuit.

Turning now to an overview of the aspects of the invention, one or more embodiments of the invention address the above-described shortcomings of the prior art by providing an architecture having a current supply circuit to supplement the power supplied by a voltage supply circuit.

Referring to FIG. 1, there is shown an embodiment of a processing system 100 for implementing the teachings herein. In this embodiment, the system 100 has one or more central processing units (processors) 101a, 101b, 101c, etc. (collectively or generically referred to as processor(s) 101). In one embodiment, each processor 101 may include a reduced instruction set computer (RISC) microprocessor. Processors 101 are coupled to system memory 114 and various other components via a system bus 113. Read only memory (ROM) 102 is coupled to the system bus 113 and may include a basic input/output system (BIOS), which controls certain basic functions of system 100.

FIG. 1 further depicts an input/output (I/O) adapter 107 and a network adapter 106 coupled to the system bus 113. I/O adapter 107 may be a small computer system interface (SCSI) adapter that communicates with a hard disk 103 and/or tape storage drive 105 or any other similar component. I/O adapter 107, hard disk 103, and tape storage device 105 are collectively referred to herein as mass storage 104. Operating system 120 for execution on the processing system 100 may be stored in mass storage 104. A network adapter 106 interconnects bus 113 with an outside network 116 enabling data processing system 100 to communicate with other such systems. A screen (e.g., a display monitor) 115 is connected to system bus 113 by display adaptor 112, which may include a graphics adapter to improve the performance of graphics intensive applications and a video controller. In one embodiment, adapters 107, 106, and 112 may be connected to one or more I/O busses that are connected to system bus 113 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 113 via user interface adapter 108 and display adapter 112. A keyboard 109, mouse 110, and speaker 111 all interconnected to bus 113 via user interface adapter 108, which may include, for example, a Super I/O chip integrating multiple device adapters into a single integrated circuit.

In exemplary embodiments, the processing system 100 includes a graphics processing unit 130. Graphics processing unit 130 is a specialized electronic circuit designed to manipulate and alter memory to accelerate the creation of images in a frame buffer intended for output to a display. In general, graphics processing unit 130 is very efficient at manipulating computer graphics and image processing, and has a highly parallel structure that makes it more effective than general-purpose CPUs for algorithms where processing of large blocks of data is done in parallel.

Thus, as configured in FIG. 1, the system 100 includes processing capability in the form of processors 101, storage capability including system memory 114 and mass storage 104, input means such as keyboard 109 and mouse 110, and output capability including speaker 111 and display 115. In one embodiment, a portion of system memory 114 and mass storage 104 collectively store an operating system to coordinate the functions of the various components shown in FIG. 1. The following circuits 200-400 shown in FIGS. 2-4 can be implemented in or coupled to one or more components of the processing system 100.

Figure 2:
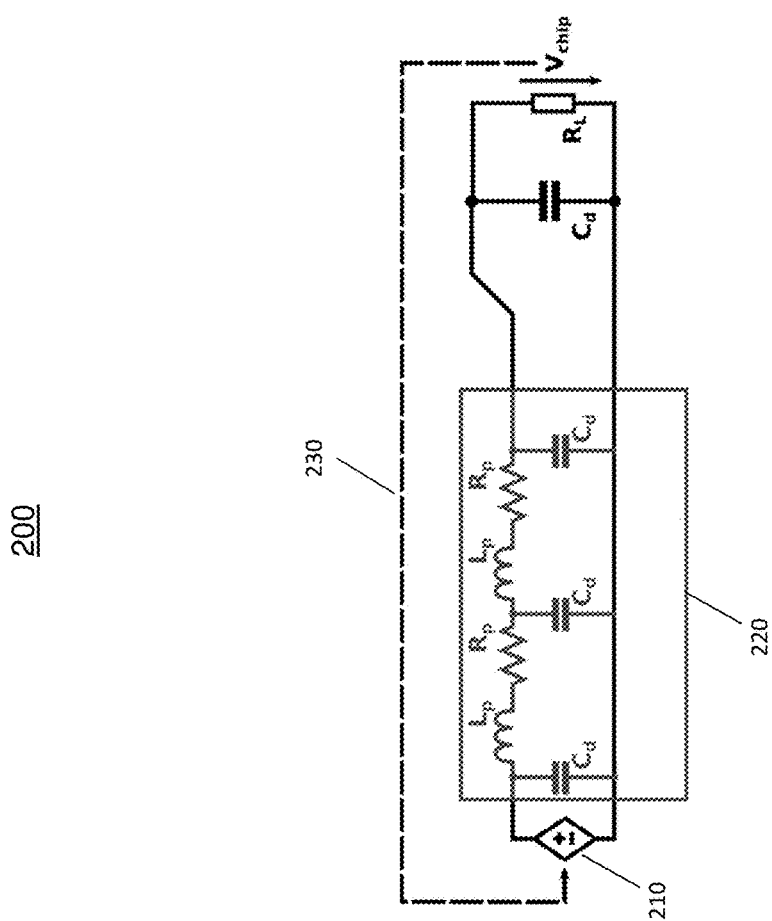
FIG. 2 depicts a power supply circuit.

FIG. 2 depicts a voltage supply circuit 200 with decoupling capacitors on the supply path of the voltage supply circuit 200. The voltage supply circuit 200 includes a voltage source 210 that is coupled to a supply path 220. The voltage supply circuit 200 can be indirectly controlled by the voltage detected at a load, such as the chip voltage. As shown, the supply path 220 includes a plurality of decoupling capacitors $C_d$ to maintain the integrity of the power supplied to the load $R_L$ during an event causing power fluctuations at the load $R_L$. The number of decoupling capacitors $C_d$ also requires additional space on the limited area on the circuit board, chip, or integrated circuit.

In addition, the supply path 220 can have parasitic effects on the supply path 220 including parasitic inductances $L_p$ and resistances $R_p$. The voltage source 210 of the voltage supply circuit 200 can be controlled by a feedback signal 230 from a controller or processor (not shown). For example, in the event the power received at the load $R_L$ is insufficient, the voltage provided to the load $R_L$ can be increased. Alternatively, if the power received at the load $R_L$ is sufficient, the voltage can be reduced.

Figure 3:
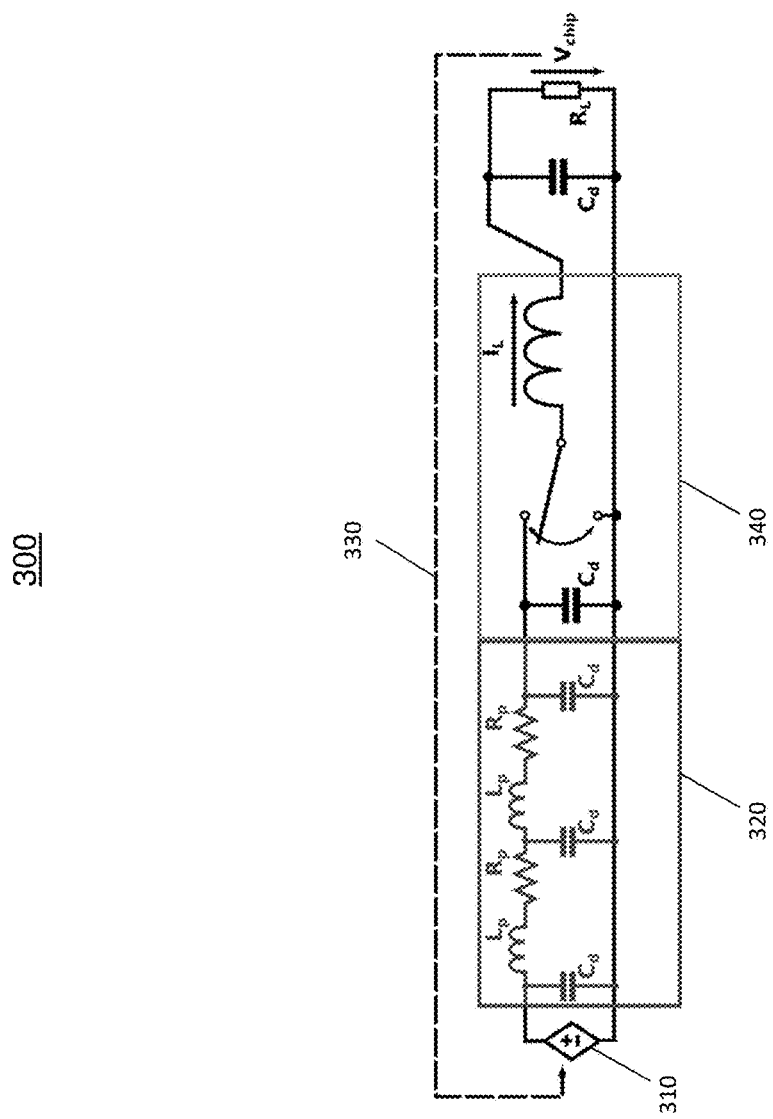
FIG. 3 depicts a different configuration of a power supply circuit.

FIG. 3 depicts another power supply circuit 300 including a voltage converter near the IC. At the same power consumption at the load $R_L$ with respect the supply circuit 200, this configuration reduces the absolute supply current through the supply path 320. Therefore, when the supply current into the load $R_L$ changes, the resulting current delta is also reduced. The effect of the parasitic inductances and resistances on power noise is reduced. Similar to the voltage supply circuit 200 shown in FIG. 2, the voltage supply circuit 200 experiences parasitic effects in the supply path 320 including parasitic inductance $L_p$ and resistance $R_p$. The voltage source 310 of the voltage supply circuit 300 can be controlled by a feedback signal 230 from a controller or processor (not shown). In addition, a switch of the voltage converter 340 can be controlled to modify the voltage provided to the load $R_L$ by changing the current $I_L$ flowing through the inductor at the output of the voltage converter 340.

Figure 4:
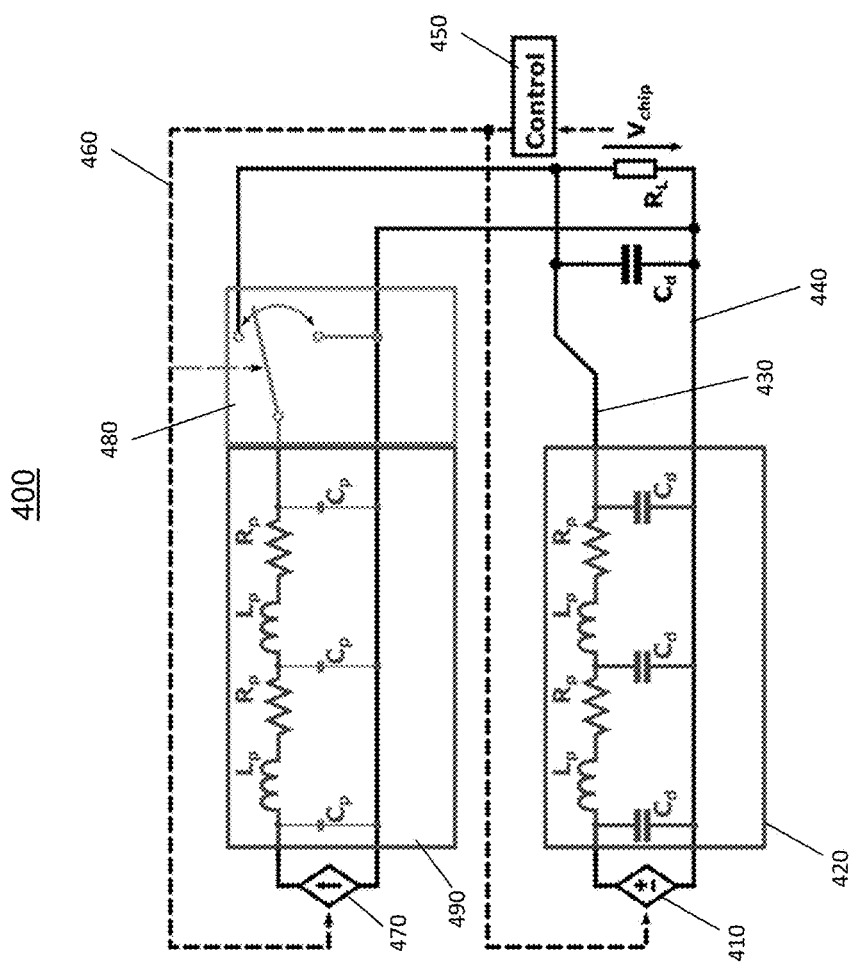
FIG. 4 depicts an architecture for mitigating power noise using a current supply in accordance with one or more embodiments of the invention.

Turning now to a more detailed description of aspects of the present invention, FIG. 4 depicts a circuit 400 used for mitigating power noise using a current supply in accordance with one or more embodiments of the invention.

Similar to the processing system 200 shown in FIG. 2, the voltage supply circuit experiences parasitic effects in the supply path 420 including parasitic inductance $L_p$, resistance $R_p$, and capacitance $C_p$. The voltage supply circuit includes a voltage source 410 that is coupled to a supply path 420 that is coupled to a load $R_L$ where the load $R_L$ can be representative of an IC or processor. A supply path 420 includes a first supply rail 430 and a second supply rail 440, such as a positive and negative supply rail, respectfully. An output of the voltage source 410 is coupled to a positive supply rail and a negative supply rail.

The voltage supply path 420 includes a decoupling capacitor $C_d$ that can compensate the changing power demands during the circuit operation and reduce the noise in the supply voltage provided to the circuit. As shown, the supply path 420 includes a plurality of decoupling capacitors $C_d$ that is coupled to the positive supply rail and the negative supply rail.

A controller 450 is coupled to the load $R_L$ and provides a feedback signal over a feedback path indicated by the dashed path 460 to control the voltage source 410 and a current source 470 of a current supply circuit. In one or more embodiments of the invention, the controller 450 is configured to sense the current or the voltage at the controller or is configured to receive a signal from the IC indicating a delay in a critical path.

A current supply circuit is used to maintain a more constant power supply that is received by the integrated circuit. The current supply circuit includes a current switch 480 at the output of the current circuit supply path 490. The current circuit supply path differs from the typical voltage supply path 420 in the parasitics. The voltage supply path is designed to have as less parasitic resistance and as less parasitic inductance as possible. To mitigate voltage noise at the load $R_L$ additional decoupling capacitors are introduced. The current supply path is designed to have as less parasitic resistance and as less parasitic capacitance. Parasitic inductance in the current supply path is beneficial and additional inductors may be introduced to mitigate current noise at the output to the current switch 480. The current switch 480 when in a first position is coupled to the positive supply rail. When the current switch 480 is in a second position the current from the current supply circuit is coupled to the negative supply rail. When connected to the negative supply rail, the current will charge the inductances on the supply path with energy. The additional current supply is available almost immediately after it is requested.

The controller 450 is configured to control switching of the current switch 480. In the event the power received at the load $R_L$ is insufficient, the current switch 480 is connected to the positive rail to source current to the load $R_L$. Alternatively, if the power received at the load $R_L$ exceeds a configurable threshold or limit, the current switch is connected to the negative supply rail. It should be understood that additional circuit components can be included or one or more shown circuit components can be omitted from the circuit 400.

Figure 5:
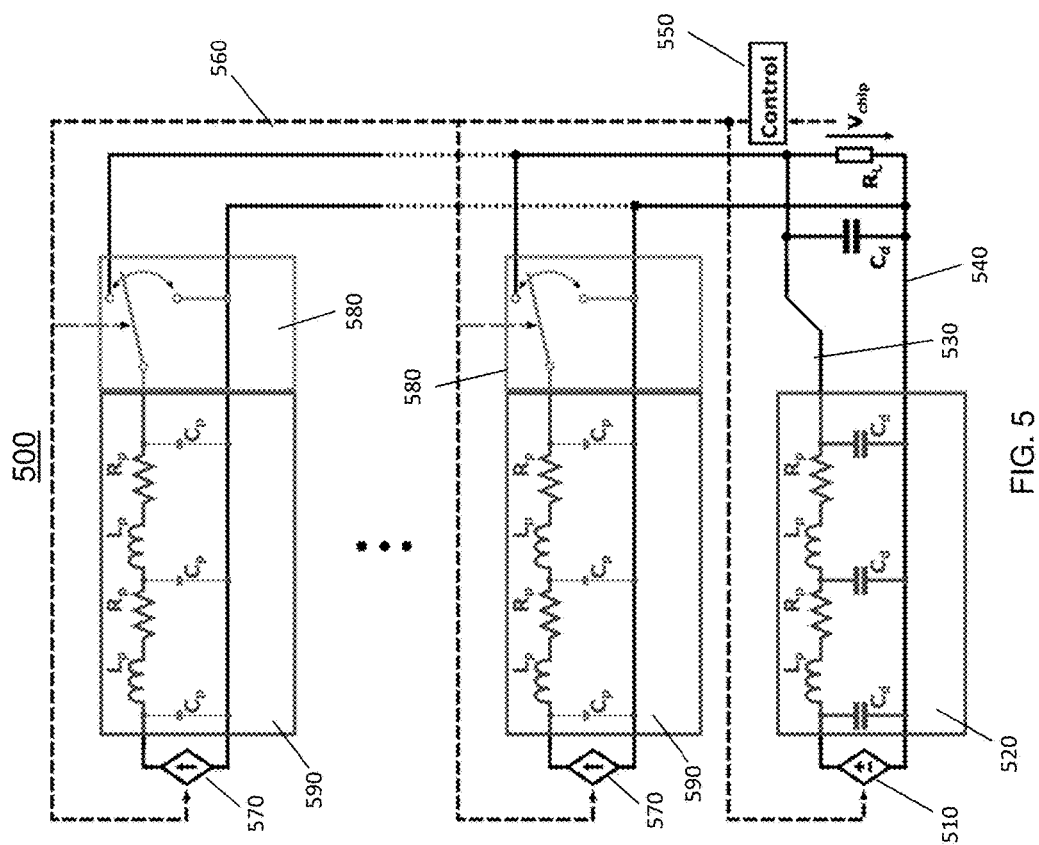
FIG. 5 depicts another architecture for mitigating power noise using a current supply in accordance with one or more embodiments of the invention.

Now referring to FIG. 5, another circuit 500 for mitigating power supply noise using a current supply circuit in accordance with one or more embodiments of the invention is shown. The circuit 500 includes a voltage supply circuit that is coupled to a controller 550, one or more current supply circuits, and a load $R_L$ such as a processor and/or an integrated circuit. The voltage supply circuit is similar to that shown in FIG. 4 and includes the voltage source 510, the voltage supply path 520, the positive supply rail 530 and negative supply rail 540.

As noted above, one or more current supply circuits are shown in FIG. 5. Each current supply circuit includes a current source 570, a current switch 580, and a current supply path 590. Each of the plurality of current supply circuits is coupled to the controller over a feedback path 560. The controller 550 can control the switching of the circuit switches 580 based on the power received at the load. That is, based on the needs of the load one or more of the current supply circuits can be switched to a first position to couple the current source 570 to the positive supply rail to source additional current to the load $R_L$.

Similar to the circuit 400 shown in FIG. 4, when the current switch 580 is in a first position, the current switch 580 is coupled to the positive supply rail, and when the current switch 580 is in a second position, it is coupled to the negative supply rail. The current supplied to the negative supply rail will charge the inductances on this path with energy which removes a portion of the parasitic effects. The additional current supply is available almost immediately after it is requested providing an added benefit to the performance of the system.

In some embodiments of the invention, the current paths can be normally-OFF or normally-ON. In some embodiments, the systems can include both normally-OFF and normally-ON current paths. In a non-limiting example, for a configuration having an intermediate power level and an increasing work-load, the normally-OFF paths can be switched on to mitigate the voltage drop that can result from the increased work-load. Alternatively, for a configuration having an intermediate power level and a decreasing work-load, the normally-ON paths can be switched OFF to mitigate the voltage peak that can result from the reduced work-load. It is to be understood that other configurations can be used and are not limited by the examples described herein.

Although two current supply circuits are shown, it should be understood that any number of current supply circuits can be coupled to the system to provide a granular level of power supplementation. Z-processors may have different load requirements that require a particular level of supplementation. The controller 550 can be configured to detect the needs of the load $R_L$ and operate one or more of the current supply circuits independently of the other current supply circuits.

Now referring to FIG. 6, a flowchart of a method 600 for mitigating power noise using a current supply in accordance with one or more embodiments of the invention. The method 600 can be implemented in the circuits 400 and 500 or other architecture that is similar to the non-limiting examples described above. The method 600 begins at block 602 and proceeds to block 604 which include providing power to an integrated circuit, wherein a first circuit is coupled to the integrated circuit over a first path. The method 600 at block 606 includes determining a variation of a current level of the integrated circuit. In one or more embodiments of the invention, the critical delay is detected at the IC. In one or more embodiments of the invention, the variation of the current level can be estimated based on the real-time measurements of electrical values or based on the current or predicted work-load of the integrated circuit. At block 608, the method 600 provides for providing power from the second circuit to the integrated circuit based at least in part on the determined variation, wherein the second circuit is coupled to the integrated circuit over a second path. When a voltage drop or critical delay meets a threshold, the controller can provide a signal to a current switch of the current supply circuit to supplement the power received at the IC. Also, in the event the threshold is not met the current switch can be coupled to the negative supply rail which can charge the inductances. The method 600 ends at block 610.

The techniques described herein provide for an improvement in performance over the prior art by reducing the parasitic effects in the circuit which directly impact the performance delay experienced at a load. For example, the parasitic effects of inductance, resistance, and capacitance of the supply path are reduced by adding one or more supplemental current supply circuits.

In addition, the architecture described above provides a fine level of granularity in providing additional power to the processor or load that reduces the impacts of power variation seen at the processor. One or more current supply circuits can be coupled to the processor and activated as needed in combination with the voltage supply source. Finally, the technological contribution includes providing a reliable power supply to a high-speed processor for high-performance and complex operations.

The present invention may be a system, a method, and/or a computer program product at any possible technical detail level of integration. The computer program product may include a computer-readable storage medium (or media) having computer-readable program instructions thereon for causing a processor to carry out aspects of the present invention.

The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer-readable program instructions described herein can be downloaded to respective computing/processing devices from a computer-readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer-readable program instruction by utilizing state information of the computer-readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the function/act specified in the flowchart and/or block diagram block or blocks.

The computer-readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for mitigating power noise using a current supply, the method comprising:
   providing power to an integrated circuit, wherein a first circuit is coupled to the integrated circuit over a first path;
   determining a variation of a current level of the integrated circuit; and
   providing additional power from a second circuit to the integrated circuit based at least in part on the determined variation, wherein the second circuit is coupled to the integrated circuit over a second path.

2. The method of claim 1, wherein the first circuit is a voltage supply circuit and the second circuit is a current supply circuit.

3. The method of claim 1, wherein the determined variation is based on at least one of sensing a critical path delay in the integrated circuit or estimating the determined variation based at least in part on measuring or estimating a work-load in the integrated circuit.

4. The method of claim 2, further comprising switching one or more current supply circuits based at least in part on the determined variation.

5. The method of claim 2, further comprising controlling, by a controller, configured to provide a signal to the current supply circuit and the voltage supply circuit based on the determined variation.

6. The method of claim 2, wherein providing additional power includes switching a current switch of the current supply circuit from a second position to a first position.

7. The method of claim 6, wherein the first position connects the current switch to a positive rail of the second path based at least in part on the determined variation.

8. The method of claim 6, wherein the second position connects the current switch to a negative rail of the second path to charge inductances on the first path and path.

9. The method of claim 6, further comprising switching the current switch to the first position when the current level indicates a voltage drop based on a threshold.

10. The method of claim 6, further comprising switching the current switch to the second position when the current level indicates a voltage peak based on a threshold.

11. A system for mitigating power noise using a current supply, the system comprising:
    an integrated circuit operably coupled to a first circuit over a first path;
    a controller configured to determine a variation of a current level in the integrated circuit; and
    a second circuit operably coupled to the integrated circuit over a second path, wherein the second circuit is configured to provide additional power to the integrated circuit based at least in part on the determined variation of the current level.

12. The system of claim 11, wherein the first circuit is a voltage supply circuit and the second circuit is a current supply circuit.

13. The system of claim 11, wherein the determined variation is based on at least one of sensing a critical path delay in the integrated circuit or estimating the determined variation based at least in part on measuring or estimating a work-load in the integrated circuit.

14. The system of claim 12, wherein the controller is configured to provide a signal to the current supply circuit and the voltage supply circuit based on the determined variation.

15. The system of claim 12, wherein the controller is configured to switch the current switch to the first position when the current level indicates a voltage drop based on a threshold.

16. The system of claim 12, wherein the controller is configured to switch the current switch to the second position when the current level indicates a voltage peak based on a threshold.

17. The system of claim 12, wherein one or more current supply circuits are switched based at least in part on the determined variation.

18. The system of claim 12, wherein the current supply circuit is configured to provide additional power by switching a current switch of the current supply circuit from a second position to a first position.

19. The system of claim 18, wherein the first position connects the current switch to a positive rail of the second path based at least in part on the determined variation.

20. The system of claim 18, wherein the second position connects the current switch to a negative rail of the second path to charge inductances on the first path.

* * * * *